US011121850B1

(12) United States Patent
Reinhold et al.

(10) Patent No.: US 11,121,850 B1
(45) Date of Patent: Sep. 14, 2021

(54) SIGNAL ANALYSIS METHOD AND SIGNAL ANALYSIS MODULE

(71) Applicant: Rohde & Schwarz GmbH & Co. KG, Munich (DE)

(72) Inventors: Michael Reinhold, Munich (DE); Hela Jedda, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/919,753

(22) Filed: Jul. 2, 2020

(51) Int. Cl.
H04L 7/00 (2006.01)
H04L 7/033 (2006.01)
H03L 7/081 (2006.01)

(52) U.S. Cl.
CPC .......... H04L 7/0025 (2013.01); H03L 7/0814 (2013.01); H04L 7/0087 (2013.01); H04L 7/033 (2013.01)

(58) Field of Classification Search
CPC ........ H03K 3/013; H03K 5/153; H03K 5/159; H03K 7/02; H03K 93/02; H03K 19/003; H03K 19/094; H03L 7/0814; H04B 17/00; H04L 7/00; H04L 7/03; H04L 7/06; H04L 7/0025; H04L 7/0087; H04L 25/34; H04L 27/06

USPC ..... 326/31, 87; 327/309, 323; 375/353, 355, 375/364, 371–376
See application file for complete search history.

(56) References Cited

U.S. PATENT DOCUMENTS

| | | | |
|---|---|---|---|
| 2006/0109917 A1* | 5/2006 | Fonseka | H04L 25/4908 375/242 |
| 2011/0311008 A1 | 12/2011 | Slezak et al. | |
| 2013/0241622 A1* | 9/2013 | Zerbe | H03K 3/013 327/323 |
| 2015/0207574 A1 | 7/2015 | Schoen et al. | |
| 2018/0241540 A1* | 8/2018 | Shibasaki | H04L 7/02 |
| 2020/0287702 A1* | 9/2020 | Toi | H04L 7/0037 |
| 2021/0058280 A1* | 2/2021 | Lee | H04L 27/2278 |

* cited by examiner

Primary Examiner — Shawkat M Ali
(74) Attorney, Agent, or Firm — Christensen O'Connor Johnson Kindness PLLC

(57) ABSTRACT

A signal analysis method is described. The signal analysis method comprises: receiving an N-ary input signal, the input signal comprising a symbol sequence; determining at least two threshold transition times of the input signal within a predetermined time period, wherein the input signal respectively crosses an amplitude threshold of several predetermined amplitude thresholds at each of the threshold transition times; determining time intervals between the threshold transition times; evaluating the time intervals based on a set of predefined conditions; and assigning the threshold transition times to at least one symbol transition based on the evaluation. Further, a signal analysis module is described.

20 Claims, 2 Drawing Sheets

SIGNAL ANALYSIS METHOD AND SIGNAL ANALYSIS MODULE

FIELD OF THE DISCLOSURE

Embodiments of the present disclosure generally relate to a signal analysis method. Embodiments of the present disclosure further relate to a signal analysis module.

BACKGROUND

Several serial transmission protocols, particularly transmission protocols for high data rates, do not have a dedicated clock signal so that a clock data recovery (CDR) based on the data signal is required.

In the state of the art, clock data recovery is done by a phase-locked loop (PLL) based clock data recovery. Typically, analog components are used in order to avoid major delays in the feedbacks done by the PLL based clock recovery, which might have an impact on the function and stability of the respective system used for clock data recovery.

In addition, digital solutions for clock data recovery are known in the state of the art.

For instance, phase interpolation techniques are used wherein the phase or rather the phase position of the clock signal is corrected in a feedback-controlled manner. The phase information of the data signal as well as the one of the clock signal are compared and used for controlling a phase interpolation. Thus, the respective information gathered is used for reconstructing the clock signal. The phase interpolation techniques ensure to track frequency shifts, for instance frequency shifts that occur in spread spectrum clocking (SSC) modulations. However, the technique is critical with regard to latency due to the feedback.

Another concept is based on sampling the data signal with a high sampling rate in an uncontrolled manner, also called blind oversampling. Edges in the data signal are detected which are used for determining the sampling times for generating the clock signal and recovering the respective data. However, this approach may not be capable of recovering the clock in real time if the data signal has a high data rate.

Accordingly, there is a need for a possibility enabling clock data recovery for N-ary serial signals, e.g. PAM-N signals, at high data rates with a large area of application.

SUMMARY

Embodiments of the present disclosure provide examples of a signal analysis method. In an embodiment, the signal analysis method comprises the following steps:

receiving an N-ary input signal, the input signal comprising a symbol sequence, wherein each symbol of the symbol sequence has one of N different amplitude values, and wherein N is an integer bigger than 2;

determining at least two threshold transition times of the input signal within a predetermined time period, wherein the input signal respectively crosses an amplitude threshold of several predetermined amplitude thresholds at each of the threshold transition times;

determining time intervals between the threshold transition times;

evaluating the time intervals based on a set of predefined conditions; and assigning the threshold transition times to at least one symbol transition based on the evaluation.

Between each adjacent pair of possible signal levels of the input signal, there is an amplitude threshold, also called decision threshold, which is used to decide whether the input signal value changes from level n to level m, wherein n and m are integers.

Thus, generally there are (N−1) different decision thresholds for the N-ary input signal, e.g. four different decision thresholds if the input signal is established as a 5-ary signal such as PAM-5.

It is noted that, in principle, the values of decision thresholds for ascending and descending signal transitions could be chosen to be different from each other. Without restriction of generality, the decision thresholds for ascending and descending transitions will be assumed to be equal in the following.

The signal analysis method according to embodiments of the present disclosure is based on the idea to analyze the time intervals between the times at which the input signal crosses different decision thresholds in order to determine which of these transition times belong to the same symbol transition, i.e. to the same signal edge.

According to the present disclosure, the time intervals are analyzed without a prior decoding of the input signal. In other words, the individual threshold transition times are assigned to the respective symbol transition based on the predefined set of conditions without knowledge of the individual symbol values of the symbol sequence.

Thus, sets of threshold transition times belonging to a common symbol transition are identified by the set of predefined conditions.

Therein, the set of predefined conditions corresponds to a set of mathematical equations and/or mathematical inequalities that are applied to the determined time intervals.

According to an aspect of the present disclosure, the predetermined time period is equal to or bigger than two symbol intervals. Therein, the term "symbol interval" is understood to denote the length of time of a single symbol of the symbol sequence. Alternatively, the symbol interval may also be called "unit interval" (UI). Thus, the time intervals between the threshold transition times are analyzed over at least two symbols of the symbol sequence.

Of course, the time intervals between the threshold transition times may be analyzed over a significantly larger time interval, for example over several hundred, several thousand or several million unit intervals, or even more.

According to another aspect of the present disclosure the set of predefined conditions comprises a first condition, according to which the time interval between consecutive threshold transition times belonging to the same symbol transition is equal to or smaller than a first predefined maximum time interval. In other words, if two consecutive threshold transition times are apart by more than the first predefined maximum time interval, then they belong to different symbol transitions.

In a further embodiment of the present disclosure the first predefined maximum time interval is equal to half a symbol interval. Thus, if two consecutive threshold transition times are apart by more than ½ UI, then they belong to different symbol transitions.

In some embodiments, the first predefined maximal time interval depends on a number of threshold transition times within the predetermined time period. In some embodiments, the first predefined maximum time interval may become smaller if there are more threshold transition times within the predetermined time period. Likewise, the first predefined maximum time interval may become bigger if there are less threshold transition times within the predetermined time period.

According to an aspect of the present disclosure, the set of predefined conditions comprises a second condition, according to which a time interval between a first threshold transition time and a last threshold transition time belonging to the same symbol transition is equal to or smaller than a second predefined maximum time interval. Accordingly, if a time interval between any two threshold transition times is bigger than the second predefined maximum time interval, then they belong to different symbol transitions.

According to another embodiment of the present disclosure the second predefined maximum time interval is equal to one symbol period. As one unit interval is the length of one symbol in the symbol sequence, two threshold transition times being spaced apart by more than one unit interval clearly belong to different symbol transitions.

In some embodiments, the second predefined maximum time interval is equal to (N−2)/(N−1) symbol periods. Thus, for example in the case of a 5-ary input signal, the second predefined maximum time interval may be equal to ¾.

According to an aspect of the present disclosure, the set of predefined conditions comprises a third condition, according to which an amplitude of the input signal is monotonous over time intervals belonging to the same symbol transition. In other words, a threshold transition time that is associated with a falling input signal and a threshold transition time that is associated with a rising input signal belong to different symbol transitions.

In some embodiments, a set of threshold transition times is assigned to the same symbol transition, if all of the three predefined conditions described above are met by that set of threshold transition times. If however, a pair of threshold transition times does not meet at least one of the predefined conditions, then the threshold transition times belonging to that pair may be assigned to different symbol transitions.

According to another aspect of the present disclosure, at least one of a symbol value and a symbol transition time is determined based on the threshold transition times and the amplitude thresholds associated with the threshold transition times. If the number of the symbol period associated with a particular set of threshold transition times is denoted by k, then the input signal value in symbol periods k−1 and k+1 can be determined based on that set of threshold transition times.

More precisely, the symbol value in symbol period k−1 can be determined based on the smallest threshold transition time in the respective set and the slope of the input signal at the smallest threshold transition time.

If the input signal is rising at the smallest threshold transition time in the respective set, then the symbol value in the symbol period k−1 is equal to the signal level right below the decision threshold corresponding to the smallest threshold transition time in the respective set.

If the input signal is falling at the smallest threshold transition time in the respective set, then the symbol value in the symbol period k−1 is equal to the signal level right above the decision threshold corresponding to the smallest threshold transition time in the respective set.

Likewise, the symbol value in symbol period k+1 can be determined based on the largest threshold transition time in the respective set and the slope of the input signal at the smallest threshold transition time.

If the input signal is rising at the largest threshold transition time in the respective set, then the symbol value in the symbol period k+1 is equal to the signal level right above the decision threshold corresponding to the largest threshold transition time in the respective set.

If the input signal is falling at the largest threshold transition time in the respective set, then the symbol value in the symbol period k+1 is equal to the signal level right below the decision threshold corresponding to the largest threshold transition time in the respective set.

Thus, the values of each of the symbols comprised in the symbol sequence of the input signal may be determined. In other words, the input signal is decoded, thereby generating a decoded input signal.

According to an embodiment of the present disclosure, the input signal is PAM-N coded. As already described above, N is an integer that is bigger than two. Thus, the input signal may be pulse amplitude modulated, wherein there are at least three different possible signal levels.

Embodiments of the present disclosure further provide embodiments of a signal analysis circuit or module. In an embodiment, the signal analysis module comprises an input being configured to receive an input signal. The analysis module comprises a threshold circuit or module being configured to determine at least two threshold transition times of the input signal within a predetermined time period, wherein the input signal respectively crosses an amplitude threshold of several predetermined amplitude thresholds at each of the threshold transition times. The analysis module further comprises a processing circuit or module, the processing module being configured to determine time intervals between the threshold transition times. The processing module is configured to evaluate the time intervals based on a set of predefined conditions. The processing module further is configured to assign the threshold transition times to at least one symbol transition based on the evaluation.

Regarding the advantages and further properties of the signal analysis module, reference is made to the explanations given above with regard to the signal analysis method, which also hold for the signal analysis module and vice versa.

According to an aspect of the present disclosure, the predetermined time period is equal to or bigger than two symbol intervals. Thus, the time intervals between the threshold transition times are analyzed over at least two symbols of the symbol sequence.

According to another aspect of the present disclosure, the set of predefined conditions comprises a first condition, according to which the time interval between consecutive threshold transition times belonging to the same symbol transition is equal to or smaller than a first predefined maximum time interval. In other words, if two consecutive threshold transition times are apart by more than the first predefined maximum time interval, then they belong to different symbol transitions.

In some embodiments, the first predefined maximum time interval is equal to half a symbol interval. In other words, if two consecutive threshold transition times are apart by more than ½ UI, then they belong to different symbol transitions.

In a further embodiment of the present disclosure, the first predefined maximal time interval depends on a number of threshold transition times within the predetermined time period. In some embodiments, the first predefined maximum time interval may become smaller if there are more threshold transition times within the predetermined time period. Likewise, the first predefined maximum time interval may become bigger if there are less threshold transition times within the predetermined time period.

According to another aspect of the present disclosure, the set of predefined conditions comprises a second condition, according to which a time interval between a first threshold transition time and a last threshold transition time belonging to the same symbol transition is equal to or smaller than a second predefined maximum time interval. In other words, if a time interval between any two threshold transition times is bigger than the second predefined maximum time interval, then they belong to different symbol transitions.

In some embodiments, the second predefined maximum time interval is equal to one of one symbol period. Namely a single symbol period, and (N−2)/(N−1) symbol periods. As one unit interval is the length of one symbol in the symbol sequence, two threshold transition times being spaced apart by more than one unit interval clearly belong to different symbol transitions. However, it has turned out that the value (N2)/(N−1) for the second predefined maximum time interval yields satisfactory results. According to an embodiment of the present disclosure, the set of predefined conditions comprises a third condition, according to which an amplitude of the input signal is monotonous over time intervals belonging to the same symbol transition. In other words, a threshold transition time that is associated with a falling input signal and a threshold transition time that is associated with a rising input signal belong to different symbol transitions.

In some embodiments, the signal analysis module comprises a symbol evaluation module, the symbol evaluation module being configured to determine at least one of a symbol value and a symbol transition time based on the threshold transition times and the amplitude thresholds associated with the threshold transition times.

If the number of the symbol period associated with a particular set of threshold transition times is denoted by k, then the input signal value in symbol periods k−1 and k+1 can be determined based on that set of threshold transition times.

More precisely, the symbol value in symbol period k−1 can be determined based on the smallest threshold transition time in the respective set and the slope of the input signal at the smallest threshold transition time, while the symbol value in symbol period k+1 can be determined based on the largest threshold transition time in the respective set and the slope of the input signal at the smallest threshold transition time.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
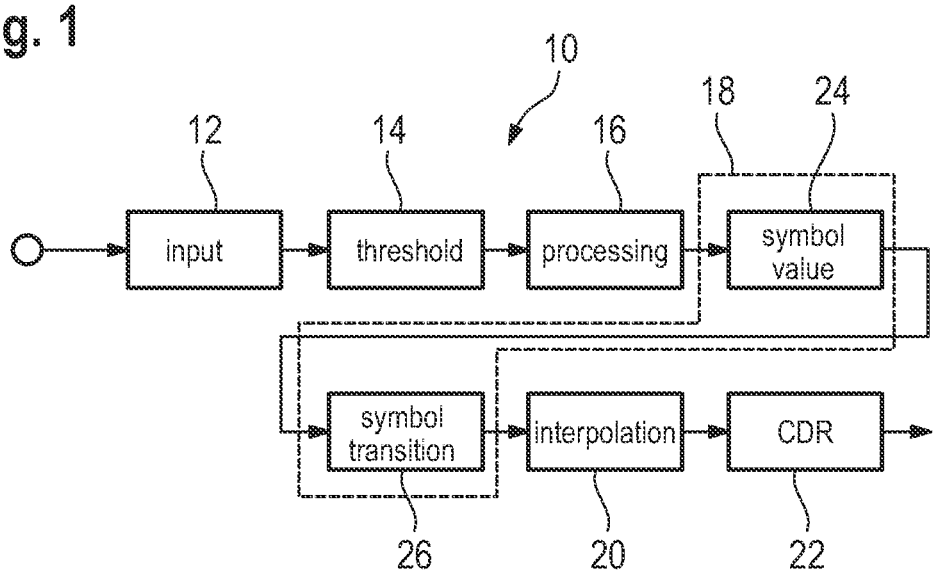
FIG. 1 shows a block diagram of a signal analysis circuit or module according to an embodiment of the disclosure.

FIG. 1 shows a block diagram of a signal analysis circuit or module 10. The signal analysis module 10 comprises an input 12, a threshold circuit or module 14, a processing circuit or module 16, a symbol evaluation circuit or module 18, an interpolation circuit or module 20, and a clock recovery circuit or module 22. The symbol evaluation module 18 further comprises a symbol value circuit or module 24 and a symbol transition circuit or module 26.

Therein and in the following, the term "module" is understood to denote components that comprise suitable hardware and/or software. Thus, the term "module" comprises the meanings "pure software", "pure hardware" and "combination of software and hardware", as will be appreciated by the person skilled in the art. Such hardware and/or software can be implemented in one or more circuits, as further described below.

Generally, the signal analysis module 10 may be part of a measurement instrument, for example of an oscilloscope or of a vector network analyzer. The threshold module 14 is connected to the input 12 downstream of the input 12.

In the context of the present disclosure, the terms "downstream" and "upstream" are understood to denote directions of signal propagation within the signal analysis module 10, wherein electrical signals propagate from the upstream component to the downstream component. In FIG. 1, the directions of signal propagation are indicated by the respective arrows.

The processing module 16 is connected to the threshold module 14, wherein the processing module 16 is located downstream of the threshold module 14. The symbol evaluation module 18 is connected to the processing module 16, wherein the symbol evaluation module 18 is located downstream of the processing module 16.

The interpolation module 20 is connected to the symbol evaluation module 18, wherein the interpolation module 20 is located downstream of the symbol evaluation module 18. The clock recovery module 22 is connected to the interpolation module 20, wherein the clock recovery module 22 is located downstream of the interpolation module 20.

Figure 2:
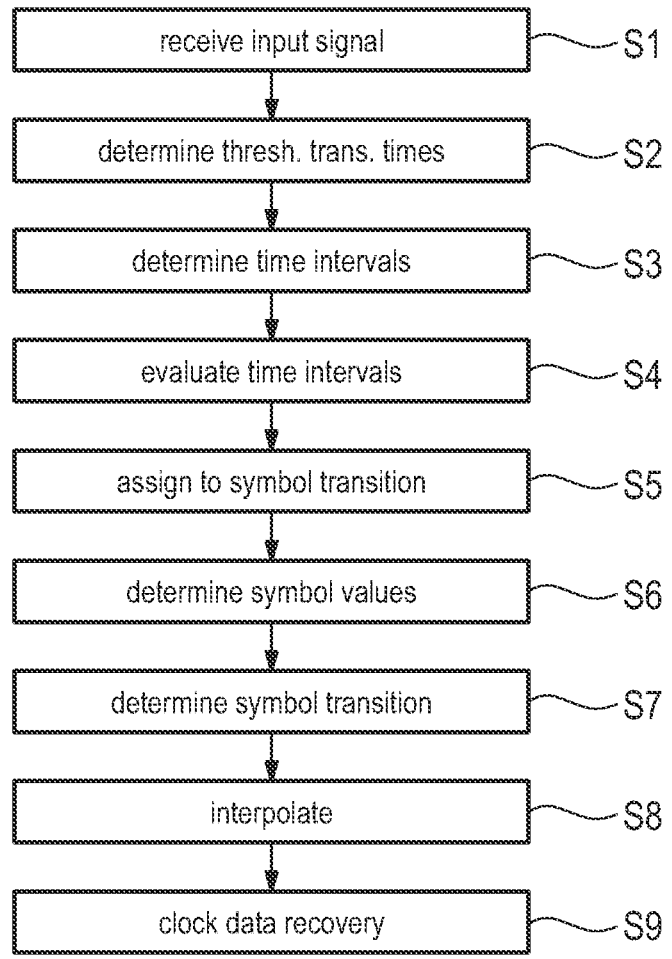
FIG. 2 shows a flow chart of a signal analysis method according to an embodiment of the disclosure.

The signal analysis module 10 is configured to perform the representative signal analysis method described in the following with reference to FIG. 2. An N-ary input signal is received via the input 12 (step S1). The input signal comprises a symbol sequence, wherein each symbol has one of N different amplitude values, and wherein N is an integer bigger than 2. In some embodiments, the input signal is established as a PAM-N coded signal.

The input signal may be interpolated by the input 12 in order to enhance a number of samples of the input signal, or rather the resolution of the input signal. In some embodiments, the input signal may be up-sampled by a factor of 2.

The input signal is forwarded to the threshold module 14, which determines threshold transition times of the input signal over a predetermined time period (step S2). The predetermined time period is equal to or bigger than two symbol intervals, which may also be called "unit intervals" (UI).

Figure 3:
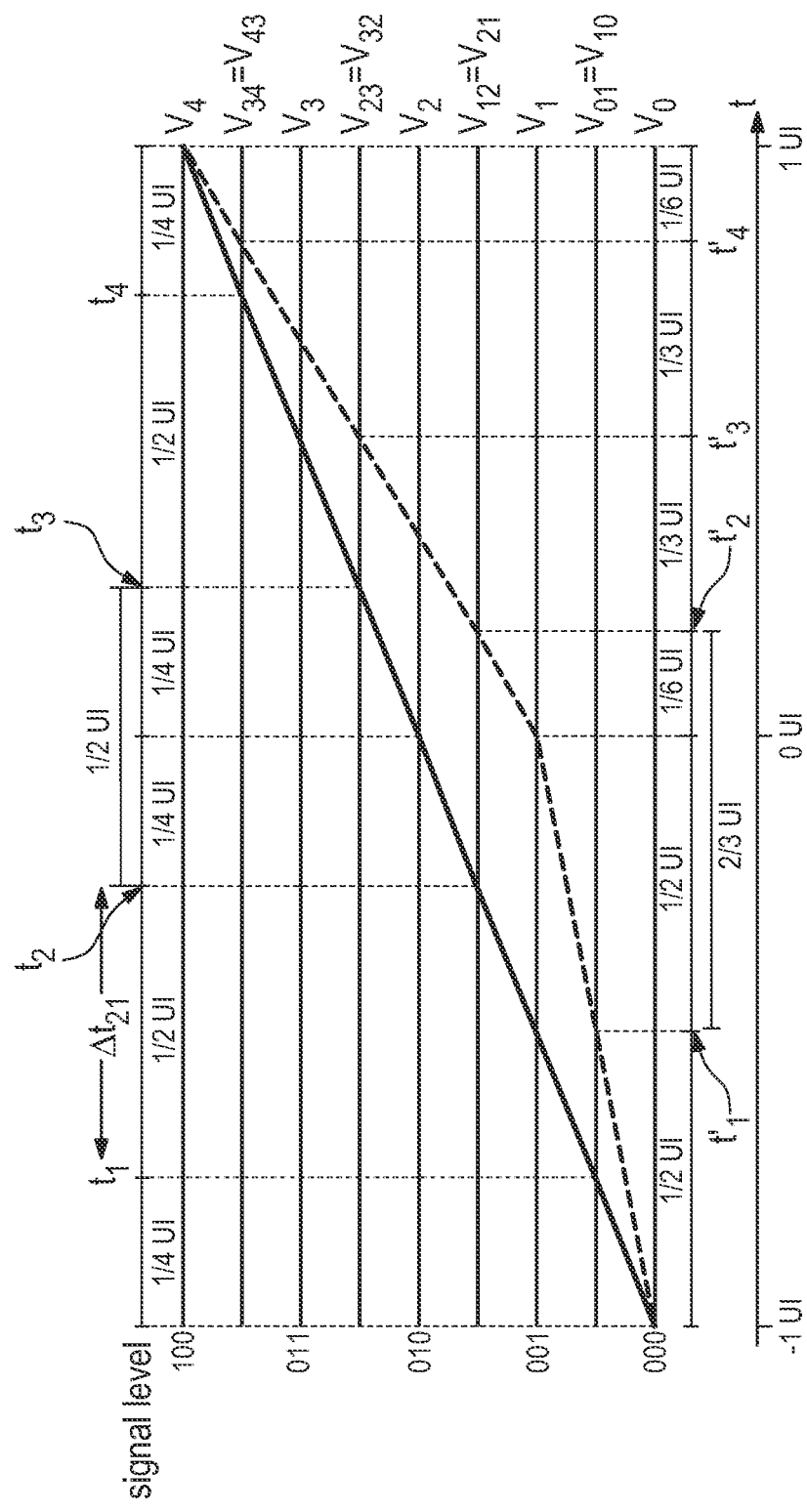
FIG. 3 schematically shows a diagram of two different input signals plotted against time.

Step S2 is illustrated in FIG. 3, which shows a diagram of two amplitudes corresponding to two different input signals plotted against time. In the example of FIG. 3, the input signal is a PAM-5 coded signal. Accordingly, there are five different possible signal levels, namely 000, 001, 010, 011, and 100 as indicated on the left side of the diagram shown in FIG. 3.

Between each adjacent pair of possible signal levels, there is a decision threshold that is used to decide whether the input signal value changes from level n to level m, wherein n and m are integers. Thus, generally there are (N−1) different decision thresholds, i.e. four different decision thresholds $V_{01}=V_{10}$, $V_{12}=V_{21}$, $V_{23}=V_{32}$, and $V_{34}=V_{43}$ in the case of PAM-5.

It is noted that, in principle, the values of decision thresholds for ascending and descending signal transitions could be chosen to be different from each other. For example, the decision threshold $V_{01}$ for the transition 000→001 could be different from the decision threshold $V_{10}$ for the transition 001→000.

Without restriction of generality, the decision thresholds for ascending and descending transitions will be assumed to be equal in the following. Moreover, while linear signal edges are shown in FIG. 3, this does not need to be the case. Of course, the signal edges could also be non-linear. Without restriction of generality, the signal edges will be described to be linear in the following.

The threshold transition times determined in step S2 are the times at which the input signal crosses one of the decision thresholds $V_{ij}$ described above. In some embodiments, this means that the times at which the input signal crosses one of the signal levels, i.e. $V_0$, $V_1$, $V_2$, $V_3$ or $V_4$ in FIG. 3, are not part of the threshold transition times.

In the example shown in FIG. 3, the determined threshold transition times would thus be $t_1$, $t_2$, $t_3$ and $t_4$ for the upper input signal illustrated in the diagram, and $t'_1$, $t'_2$, $t'_3$ and $t'_4$ for the lower input signal illustrated in the diagram. The determined threshold transition times are then forwarded to the processing module 16.

The processing module 16 determines time intervals $\Delta t_{ij}$ between the transition times $t_i$ and $t_j$ (step S3), wherein i and j are integers that each run from 1 to the total number of threshold transition times within the predetermined time period.

In FIG. 3, one example for such a time interval $\Delta t_{ij}$ is shown, namely the time interval $\Delta t_{21}$ between $t_1$ and $t_2$. This is just one example, all other possible time intervals $\Delta t_{ij}$ may be determined as well, e.g. $t_{31}$, $t_{32}$, $t_{41}$, etc.

The determined time intervals $\Delta t_{ij}$ are then evaluated based on a set of predefined conditions by the processing module 16 (step S4). The set of predefined conditions corresponds to a set of mathematical equations and/or mathematical inequalities that are applied to the determined time intervals. More precisely, the set of predefined conditions comprises the following conditions:

According to a first condition, the time interval $\Delta t_{i+1,i}$, between consecutive threshold transition times belonging to the same symbol transition is equal to or smaller than a first predefined maximum time interval $\Delta t_{max,1}$.

In some embodiments, the first predefined maximum time interval $\Delta t_{max,1}$ is equal to half a symbol interval, i.e $$\Delta t_{max,1} = \frac{1}{2} UI.$$

In other words, if two consecutive threshold transition times are apart by more than ½ UI, then they belong to different symbol transitions.

Generally, the first predefined maximum time interval $\Delta t_{max,1}$ may depend on the overall number of threshold transition times within the predetermined time period. In some embodiments, the first predefined maximum time interval $\Delta t_{max,1}$ may become smaller if there are more threshold transition times within the predetermined time period. Likewise, the first predefined maximum time interval $\Delta t_{max,1}$ may become bigger if there are less threshold transition times within the predetermined time period.

According to a second condition, a time interval $\Delta t_{ij}$ between a first threshold transition time $t_i$ within a symbol transition and a last threshold transition time $t_j$ belonging to the same symbol transition is equal to or smaller than a second predefined maximum time interval $\Delta t_{max,2}$.

As 1 UI is the length of one symbol in the symbol sequence, one possible choice for the second predefined maximum time interval is $\Delta t_{max,2}=1$ UI.

However, it has turned out that the choice $$\Delta t_{max,2} = \frac{N-2}{N-1} UI,$$

i.e.

$$\Delta t_{max,2} = \frac{5}{4} UI$$

yields reliable results.

In other words, if a time interval between any two threshold transition times $t_i$ and $t_j$ is bigger than the second predefined maximum time interval, then they belong to different symbol transitions.

According to a third condition, an amplitude of the input signal is monotonous over time intervals belonging to the same symbol transition. In other words, a threshold transition time that is associated with a falling input signal and a threshold transition time that is associated with a rising input signal belong to different symbol transitions.

Based on the predefined conditions, each of the threshold transition times $t_i$ is assigned to one symbol transition (step S5). More precisely, a set of threshold transition times $\{t_i\}$ is assigned to the same symbol transition, if all of the three predefined conditions are met by that set of threshold transition times $\{t_i\}$.

If however, a pair of threshold transition times $t_i$ does not meet at least one of the predefined conditions, then the threshold transition times belonging to that pair are assigned to different symbol transitions.

Thus, as a result of step S5, sets of threshold transition times $\{t_i\}$ are obtained that belong to the same symbol transition, i.e. to the same signal edge of the input signal. These sets of threshold transition times $\{t_i\}$ are forwarded to the symbol evaluation module 18, or more precisely to the symbol value module 24.

Symbol values are determined based on the determined sets of threshold transition times $\{t_i\}$ by the symbol value module 24 (step S6). Within each set of threshold transition times $\{t_i\}$, there is a smallest threshold transition time and a largest threshold transition time.

If the number of the symbol period associated with a particular set of threshold transition times $\{t_i\}$ is denoted by k, then the input signal value in symbol periods k−1 and k+1 can be determined based on that set of threshold transition times $\{t_i\}$. More precisely, the symbol value in symbol period k−1 can be determined based on the smallest threshold transition time in the respective set $\{t_i\}$ and the slope of the input signal at the smallest threshold transition time.

If the input signal is rising at the smallest threshold transition time in the respective set $\{t_i\}$, then the symbol value in the symbol period k−1 is equal to the signal level right below the decision threshold corresponding to the smallest threshold transition time in the respective set $\{t_i\}$.

If the input signal is falling at the smallest threshold transition time in the respective set $\{t_i\}$, then the symbol value in the symbol period k−1 is equal to the signal level right above the decision threshold corresponding to the smallest threshold transition time in the respective set $\{t_i\}$.

Likewise, the symbol value in symbol period k+1 can be determined based on the largest threshold transition time in the respective set $\{t_i\}$ and the slope of the input signal at the smallest threshold transition time.

If the input signal is rising at the largest threshold transition time in the respective set $\{t_i\}$, then the symbol value in the symbol period k+1 is equal to the signal level right above the decision threshold corresponding to the largest threshold transition time in the respective set $\{t_i\}$.

If the input signal is falling at the largest threshold transition time in the respective set $\{t_i\}$, then the symbol value in the symbol period k+1 is equal to the signal level right below the decision threshold corresponding to the largest threshold transition time in the respective set $\{t_i\}$.

Thus, in step S6, the value of each of the symbols comprised in the symbol sequence of the input signal is determined. In other words, the input signal is decoded, thereby generating a decoded input signal.

The decoded input signal is forwarded to the symbol transition module 26. Signal edge times are determined based on the decoded input signal and/or based on the determined threshold transition times $t_i$ by the symbol transition module 26 (step S7). As the symbol sequence is known, the signal edges (i.e. the symbol transition times where the symbol value changes) can be determined. The proper decision threshold for deciding whether the signal has transitioned from value a to value b is at (a+b)/2. Thus, the signal edge times can conveniently be determined by determining the times at which the input signal crosses these decision thresholds.

If necessary, the input signal may be interpolated around the signal edge times by the interpolation module 20 (step S8). Generally, the signal edge times may lie in between two consecutive samples associated with the input signal. Thus, the input signal may have to be interpolated in order to enhance the number of samples such that one of the samples is associated with each of the signal edge times. The determined signal edge times are then forwarded to the clock recovery module 22.

A clock signal underlying the input signal may be recovery by the clock recovery module 22 based on the determined signal edge times (step S9). Therein, any suitable clock recovery technique known in the state of the art may be employed. In some embodiments, the clock recovery module 22 may perform a so-called jitter CDR, wherein jitter comprised in the input signal is accounted for during the clock data recovery, such that the clock signal is recovered more precisely.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. For example, the modules described above can be implemented in circuitry. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the methodologies and technologies described herein can be implemented by special purpose hardware-based computer systems or circuits, etc., or combinations of special purpose hardware and computer instructions.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method, said signal analysis method comprising:

receiving an N-ary input signal, said input signal comprising a symbol sequence, wherein each symbol of said symbol sequence has one of N different amplitude values, and wherein N is an integer greater than 2;

determining at least two threshold transition times of said input signal within a predetermined time period, wherein said input signal respectively crosses an amplitude threshold of several predetermined amplitude thresholds at each of said threshold transition times;

determining time intervals between said threshold transition times;

evaluating said time intervals based on a set of predefined conditions; and assigning said threshold transition times to at least one symbol transition based on the evaluation.

2. The signal analysis method of claim 1, wherein said predetermined time period is equal to or greater than two symbol intervals.

3. The signal analysis method of claim 1, wherein said set of predefined conditions comprises a first condition, according to which a time interval between consecutive threshold transition times belonging to the same symbol transition is equal to or less than a first predefined maximum time interval.

4. The signal analysis method of claim 3, wherein said first predefined maximum time interval is equal to half a symbol interval.

5. The signal analysis method of claim 3, wherein said first predefined maximal time interval depends on a number of threshold transition times within said predetermined time period.

6. The signal analysis method of claim 1, wherein said set of predefined conditions comprises a second condition, according to which a time interval between a first threshold transition time and a last threshold transition time belonging to the same symbol transition is equal to or smaller than a second predefined maximum time interval.

7. The signal analysis method of claim 6, wherein said second predefined maximum time interval is equal to one symbol period.

8. The signal analysis method of claim 6, wherein said second predefined maximum time interval is equal to (N−2)/(N−1) symbol periods.

9. The signal analysis method of claim 1, wherein said set of predefined conditions comprises a third condition, according to which an amplitude of said input signal is monotonous over time intervals belonging to the same symbol transition.

10. The signal analysis method of claim 1, wherein at least one of a symbol value and a symbol transition time is determined based on said threshold transition times and said amplitude thresholds associated with said threshold transition times.

11. The signal analysis method of claim 1, wherein said input signal is Pulse Amplitude Modulation (PAM)-N coded.

12. A signal analysis circuit, said signal analysis circuit comprising an input being configured to receive an input signal,
said signal analysis circuit comprising a threshold circuit being configured to determine at least two threshold transition times of said input signal within a predetermined time period, wherein said input signal respectively crosses an amplitude threshold of several predetermined amplitude thresholds at each of said threshold transition times, said signal analysis circuit further comprising a processing circuit, said processing circuit being configured to determine time intervals between said threshold transition times, said processing circuit further being configured to evaluate said time intervals based on a set of predefined conditions, and said processing circuit further being configured to assign said threshold transition times to at least one symbol transition based on the evaluation.

13. The signal analysis circuit of claim 12, wherein said predetermined time period is equal to or greater than two symbol intervals.

14. The signal analysis circuit of claim 12, wherein said set of predefined conditions comprises a first condition, according to which a time interval between consecutive threshold transition times belonging to the same symbol transition is equal to or smaller than a first predefined maximum time interval.

15. The signal analysis circuit of claim 14, wherein said first predefined maximum time interval is equal to half a symbol interval.

16. The signal analysis circuit of claim 14, wherein said first predefined maximal time interval depends on a number of threshold transition times within said predetermined time period.

17. The signal analysis circuit of claim 12, wherein said set of predefined conditions comprises a second condition, according to which a time interval between a first threshold transition time and a last threshold transition time belonging to the same symbol transition is equal to or less than a second predefined maximum time interval.

18. The signal analysis circuit of claim 17, wherein said second predefined maximum time interval is equal to one of one symbol period and (N−2)/(N−1) symbol periods, where N is an integer equal to or greater than 3.

19. The signal analysis circuit of claim 12, wherein said set of predefined conditions comprises a third condition, according to which an amplitude of said input signal is monotonous over time intervals belonging to the same symbol transition.

20. The signal analysis circuit of claim 12, further comprising a symbol evaluation circuit, said symbol evaluation circuit being configured to determine at least one of a symbol value and a symbol transition time based on said threshold transition times and said amplitude thresholds associated with said threshold transition times.

* * * * *